United States Patent
Vermeersch

(10) Patent No.: US 7,131,862 B2
(45) Date of Patent: Nov. 7, 2006

(54) ELECTRICAL CONNECTOR WITH HORIZONTAL GROUND PLANE

(75) Inventor: Dean Camiel William Vermeersch, Harrisburg, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 11/017,125

(22) Filed: Dec. 20, 2004

(65) Prior Publication Data

US 2006/0134946 A1    Jun. 22, 2006

(51) Int. Cl.
*H01R 12/24*    (2006.01)
*H01R 12/00*    (2006.01)

(52) U.S. Cl. ..................... 439/497; 439/76.1

(58) Field of Classification Search ............... 439/497, 439/76.1, 77, 941, 610, 579
See application file for complete search history.

(56) References Cited

U.S. PATENT DOCUMENTS

| | | | |
|---|---|---|---|
| 6,255,582 B1 | 7/2001 | Miller et al. | |
| 6,380,485 B1 * | 4/2002 | Beaman et al. | 174/88 R |
| 6,431,887 B1 | 8/2002 | Yeomans et al. | |
| 6,617,939 B1 * | 9/2003 | Vermeersch | 333/28 R |
| 6,619,987 B1 * | 9/2003 | Kumamoto et al. | 439/610 |
| 6,685,511 B1 * | 2/2004 | Akama et al. | 439/610 |
| 6,739,904 B1 | 5/2004 | Wu | 439/497 |
| 6,869,308 B1 | 3/2005 | Wu | 439/497 |
| 6,893,270 B1 * | 5/2005 | Sercu | 439/76.1 |

\* cited by examiner

*Primary Examiner*—Hien Vu

(57) ABSTRACT

An electrical connector is provided that includes a housing and a circuit board provided therein. The circuit board has a body arranged along a circuit board plane, and the body includes a separable interface configured to directly join to a mating connector. A ground plane is arranged parallel to the circuit board plane. Signal contacts are provided on at least one side of the circuit board at the separable interface. Immediately adjacent signal contacts on a common side of the circuit board are configured to convey signals that are independent from one another.

20 Claims, 7 Drawing Sheets

ELECTRICAL CONNECTOR WITH HORIZONTAL GROUND PLANE

BACKGROUND OF THE INVENTION

This invention relates generally to electrical connectors, and more particularly, to electrical connectors with a horizontal ground plane.

Modern electronics use high frequency and high speed connectors particularly for use in interconnecting circuitry in electronic devices. These electronic devices typically include printed circuit boards which are used to couple data among these various electronic devices. In order to provide for a higher density of connectors on a printed circuit board, surface mount technology is utilized. With surface mounting, conductive pads located on the printed circuit board can be closely spaced, thereby allowing more contacts to be mounted in the same area of the board. Signal conductors are coupled to the conductive pads and transmit the data across the boards. Typically, the signal conductors will be coupled to the printed circuit board as a differential pair.

Due to continuing trends toward miniaturization, signal conductors are placed in closer proximity to one another, thereby leading to the potential for crosstalk between neighboring conductive contacts in different signal pairs. Thus, known connectors typically include shielding or ground planes between the signal conductors to reduce crosstalk therebetween. These connectors have a mating interface sub-assembly coupled to the end of the printed circuit board to interface with the opposing electronic device. The sub-assembly includes a plurality of stamped and formed metal contacts extending outwardly from the printed circuit board and a plurality of ground planes extending vertically and interposed between the metal contacts. However, these connectors require additional assembly time and fabrication costs.

Connectors have also been proposed that remove the mating interface sub-assembly and instead configure one edge of the printed circuit board to operate as a separable interface. The separable interface edge of the printed circuit board includes contact pads on one or both sides of the printed circuit board. The contact pads are arranged in differential pairs such that the contact pads associated with a differential pair are next to one another and located on the same side of the printed circuit board. Traces extending from the contact pads of a differential pair are also located directly next to one another. The contact pads and traces associated with one differential pair convey signals that are related to one another and more specifically convey signals that are the inverse of one another.

However, certain problems remain in connection with the signal performance.

BRIEF DESCRIPTION OF THE INVENTION

In accordance with an embodiment of the present invention, an electrical connector has been developed that includes a housing and a circuit board provided therein. The circuit board has a body arranged along a circuit board plane, and the body includes a separable interface configured to directly join to a mating connector. A ground plane is arranged parallel to the circuit board plane. Signal contacts are provided on at least one side of the circuit board at the separable interface. Immediately adjacent signal contacts on a common side of the circuit board are configured to convey signals that are independent from one another.

Certain embodiments of the present invention may also include signal contacts located on opposite sides of the circuit board that form a differential pair. Alternatively, signal contacts located immediately adjacent one another may be associated with different first and second differential pairs. Furthermore, adjacent signal contacts may not be separated by ground contacts.

Certain embodiments of the present invention may also include a ground layer embedded within the circuit board, wherein the ground layer defines the ground plane. Furthermore, the signal contacts may be arranged in a plane parallel to the ground plane and the circuit board plane.

Certain embodiments of the present invention may also include signal contacts that form a first differential pair, wherein the signal contacts are provided on opposite sides of the circuit board and opposite sides of the ground plane, and wherein the second contacts are aligned along a signal contact plane oriented perpendicular to the circuit board plane. Alternatively, the signal contacts may carry signals for separate single ended applications, wherein the signal contacts are arranged immediately adjacent to one another and are bordered on only one side by a ground contact.

DETAILED DESCRIPTION OF THE INVENTION

Figure 1:
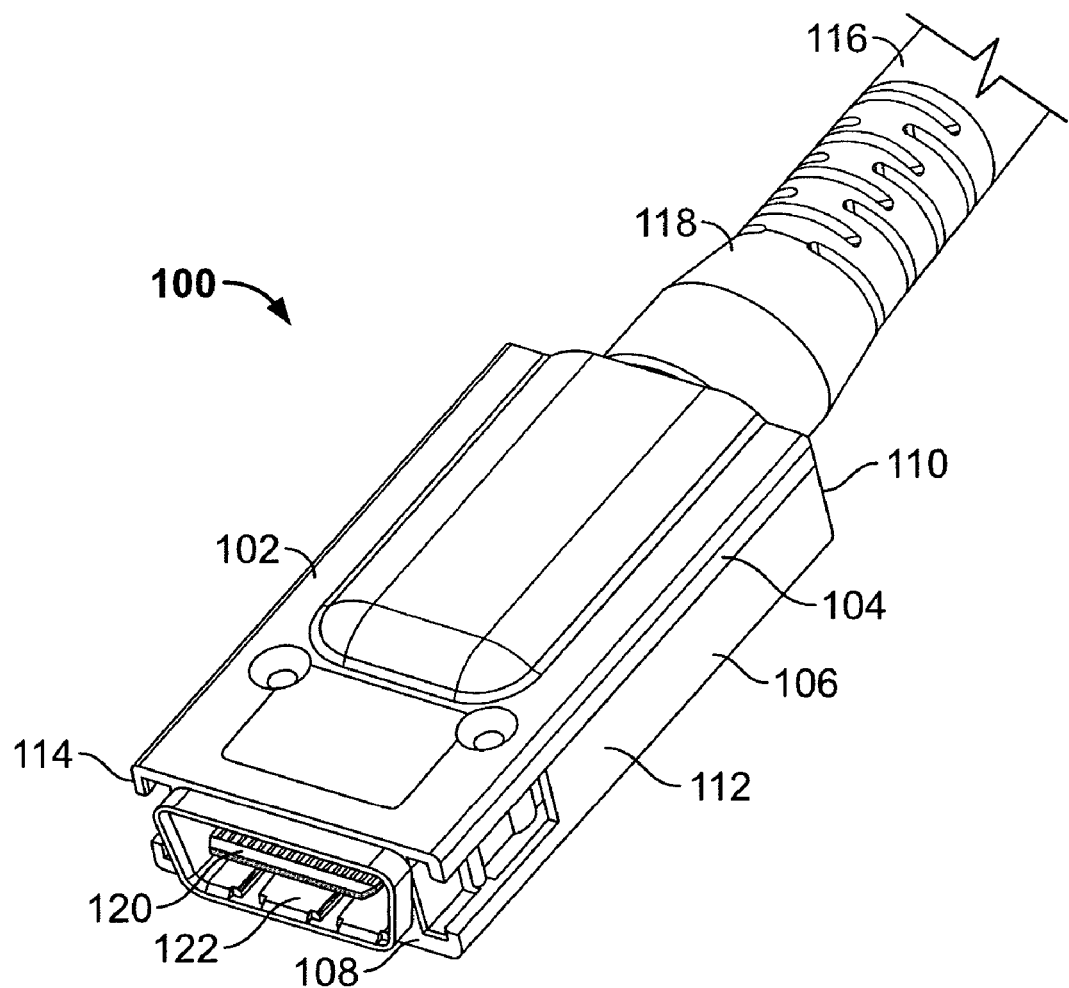
FIG. 1 illustrates a perspective view of an electrical connector formed in accordance with an embodiment of the present invention.

FIG. 1 illustrates a perspective view of an electrical connector 100 formed in accordance with an embodiment of the present invention. The electrical connector 100 includes a housing 102 capable of being coupled to a receptacle or mating connector (not shown). The housing 102 includes an upper shell 104 and a lower shell 106 and has a generally box-shaped form that is defined by an interconnect end 108, a rear end 110, and side walls 112 and 114 extending therebetween. A cable 116 is coupled to the rear end 110 of the housing 102 via a ferrule 118. The cable 116 is capable of transmitting high speed serial data and is electrically connected to an interface component, such as a printed circuit board 120, that interfaces with the receptacle (not shown). The interconnect end 108 includes an interconnect cavity 122 and the printed circuit board 120 extends at least partially into the interconnect cavity 122.

Figure 2:
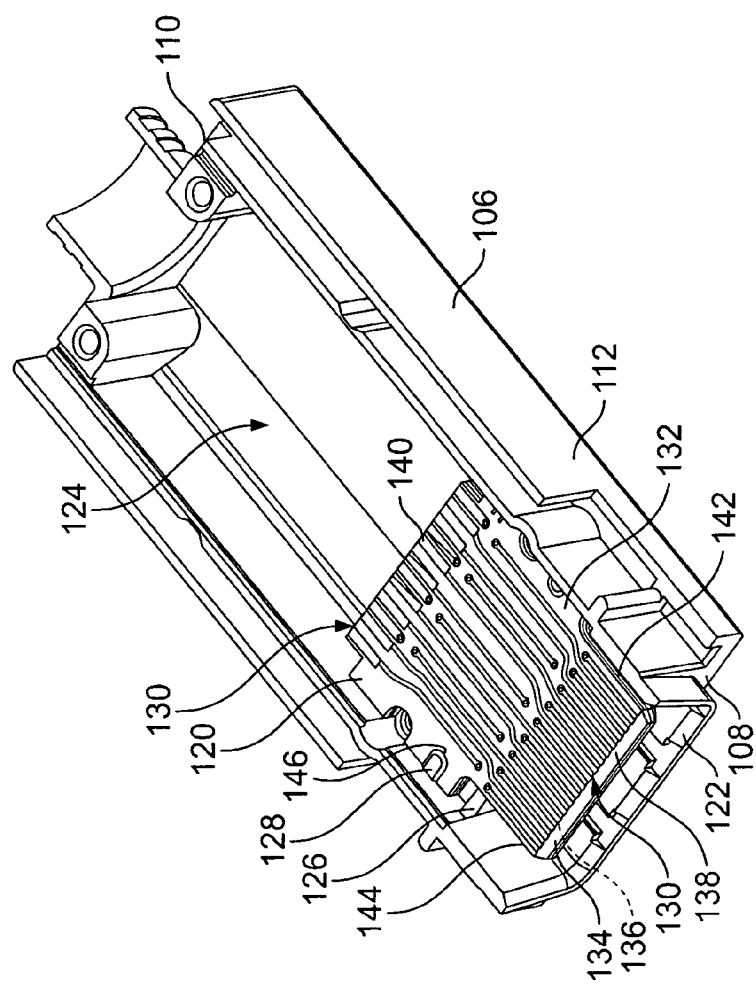
FIG. 2 illustrates a perspective view of a portion of the electrical connector shown in FIG. 1.

FIG. 2 is a perspective view of a portion of the electrical connector 100 including the lower shell 106 and the printed circuit board 120. The lower shell 106 includes a cavity 124 between the interconnect end 108 and the rear end 110, and between the side walls 112 and 114. The lower shell 106 includes a shelf 126 extending between the side walls 112 and 114 proximate to the interconnect end 108 of the housing 102. The lower shell 106 also includes keying features 128 extending inwardly from the side walls 112 and 114. The shelf 126 and the keying features 128 facilitate aligning the printed circuit board 120 within the housing 102.

The printed circuit board 120 includes circuit components, shown generally at 130, that perform signal conditioning upon high speed serial data received from cable 116. The printed circuit board 120 includes a body 132 having a top surface 134, a bottom surface 136, a separable interface end 138, a wire management end 140, and side edges 142 and 144 extending between the separable interface end 138 and the wire management end 140. The side edges 142 and 144 include notched out portions 146 that correspond to the keying features 128. The printed circuit board 120 is oriented within the cavity 124 such that a portion of the printed circuit board 120 is contained within the interconnect cavity 122. Specifically, the printed circuit board 120 is placed on the shelf 126 and the notched out portions 146 of the printed circuit board 120 conform to the keying features 128 of the lower shell 106. As such, the separable interface end 138 is positioned within the interconnect cavity 122 and is oriented to interface with the electrical components of the mating connector when the electrical connector 100 and the mating connector are mated.

Figure 3:
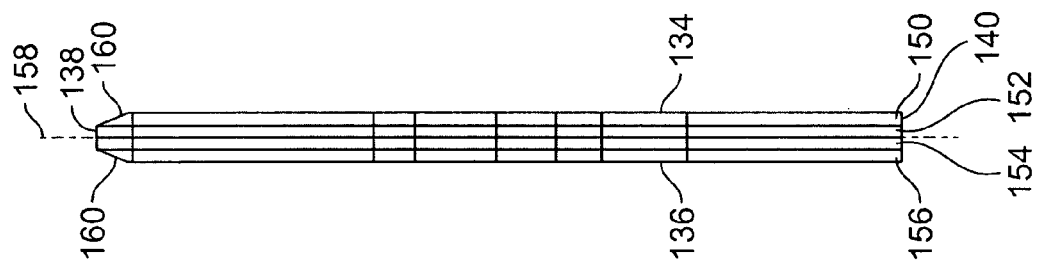
FIG. 3 illustrates a side view of an interface component for use with the electrical connector shown in FIG. 1.

FIG. 3 is a side view of the printed circuit board 120. The printed circuit board 120 includes a top signal layer 150, a top ground layer 152, a bottom ground layer 154, and a bottom signal layer 156. The top signal layer 150 and the bottom signal layer 156 include the circuit components 130 (FIG. 2). Each of the layers 150–156 extends from the wire management end 140 to the separable interface end 138 along a circuit board plane 158 that extends substantially parallel to the top surface 134 and the bottom surface 136 of the printed circuit board 120. The top signal layer 150 and the bottom signal layer 156 include a chamfered surface 160 adjacent the separable interface end 138 to facilitate insertion of the printed circuit board 120 into the mating connector when the electrical connector 100 is mated. The printed circuit board may include more or less than two ground layers. Optionally, the circuit components 130 may be coupled to only one of the top and bottom surfaces 134 and 136.

Figure 4:
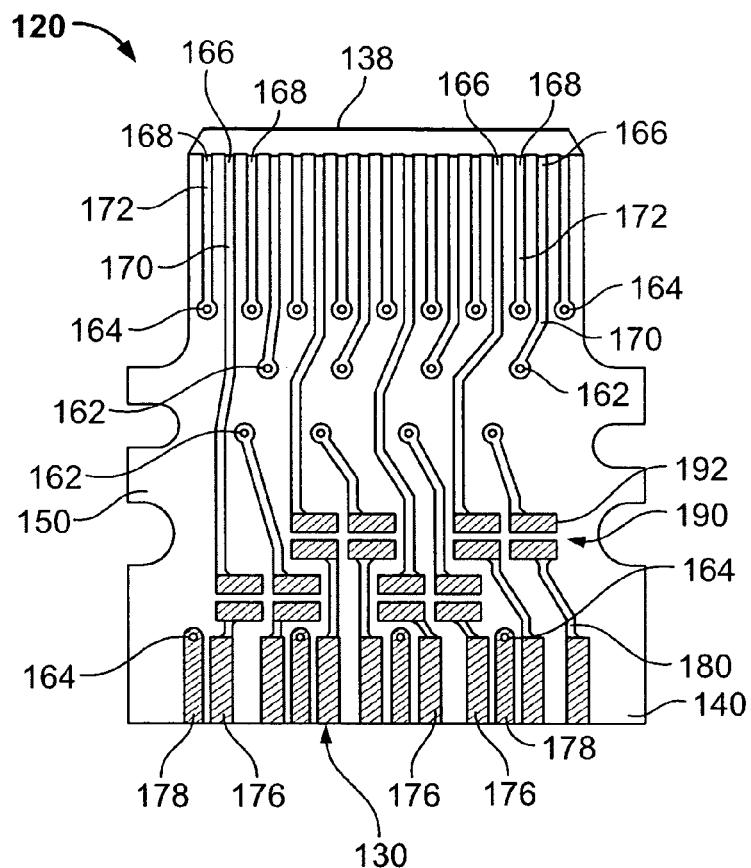
FIG. 4 illustrates a top view of a portion of the interface component of FIG. 3.

FIG. 4 illustrates a top view of the top signal layer 150 of the printed circuit board 120. The top signal layer 150 extends along a signal layer plane (not shown) that is arranged parallel to the circuit board plane 158 (FIG. 3). The top signal layer 150 includes the circuit components 130 and a plurality of vias 162 and ground vias 164. The vias 162 and ground vias 164 facilitate interconnecting the circuit components 130. The top signal layer 150 includes multiple signal contact pads 166 and multiple ground contact pads 168. The signal contact pads 166 and the ground contact pads 168 are aligned adjacent one another and located proximate the separable interface end 138. The signal contact pads 166 and the ground contact pads 168 electrically and frictionally engage corresponding circuit components (not shown) located with the mating connector. In one embodiment, each signal contact pad 166 is bordered on both sides by a ground contact pad 168. Optionally, first and second signal contact pads 166 may be arranged immediately adjacent one another on the printed circuit board 120 and are bordered on only one side by a ground contact pad 168.

The signal contact pads 166 and the ground contact pads 168 include a signal trace 170 or a ground trace 172, respectively, that extends from the separable interface end 138 to another circuit component 130. In one embodiment, at least some of the signal traces 170 are interconnected to the other circuit components 130 by the vias 162. Alternatively, at least some of the ground traces 172 may be interconnected to the other circuit components 130 by the ground vias 164. Each of the ground traces 172 extending from the separable interface end 138 are coupled to a respective ground via 164 to facilitate electrically grounding the ground contact pads 168.

The top signal layer 150 includes multiple signal solder pads 176 and multiple ground solder pads 178. The signal and ground solder pads 176 and 178 have an enlarged area configured to be joined to a wire (not shown), as will be described in detail below. Each signal solder pad 176 is connected to a wire conveying a differential pair application signal. Alternatively, each signal solder pad 176 may be connected to a wire conveying a single ended application signal. As such, each single ended signal has a single ended impedance. The signal solder pads 176 and the ground solder pads 178 are aligned adjacent one another and located proximate the wire management end 140. The signal solder pads 176 are arranged immediately adjacent at least one of a signal solder pad 176 and a ground solder pad 178. Alternatively, each signal solder pad 176 may be bordered on both sides by a ground solder pad 178. The signal solder pads 176 include a signal trace 180 that extends from the wire management end 140 to another circuit component 130, and the ground solder pads 178 are directly connected to the ground vias 164 to facilitate electrically grounding the ground solder pads 178. Optionally, the ground solder pads 178 may be connected to ground traces prior to being electrically coupled to the ground vias 164. At least some of the signal traces 180 are interconnected to the other circuit components 130 by the vias 162.

Each of the signal traces 180 extending from the wire management end 140 of the top signal layer 150 expand to form an equalizing component receiving region 190. The equalizing component receiving regions 190 each include a gap 192 and an electrical equalizing component (not shown) spanning the gap 192 therebetween. The equalizing components may be varied to afford different desired electrical characteristics to the printed circuit board 120. For instance, the equalizing components may include one resistor and one capacitor, the values for which are based upon various signal characteristics of the cable 116. By way of example only, a cable 116 having an impedance of one hundred ohms is operated with a first printed circuit board 120 having one combination of values for equalizing components, while a cable 116 having an impedance of one hundred and fifty ohms is operable with a different printed circuit board 120 having a separate combination of values for equalizing components. Optionally, the top signal layer 150 does not include the equalizing component receiving regions 190.

Figure 5:
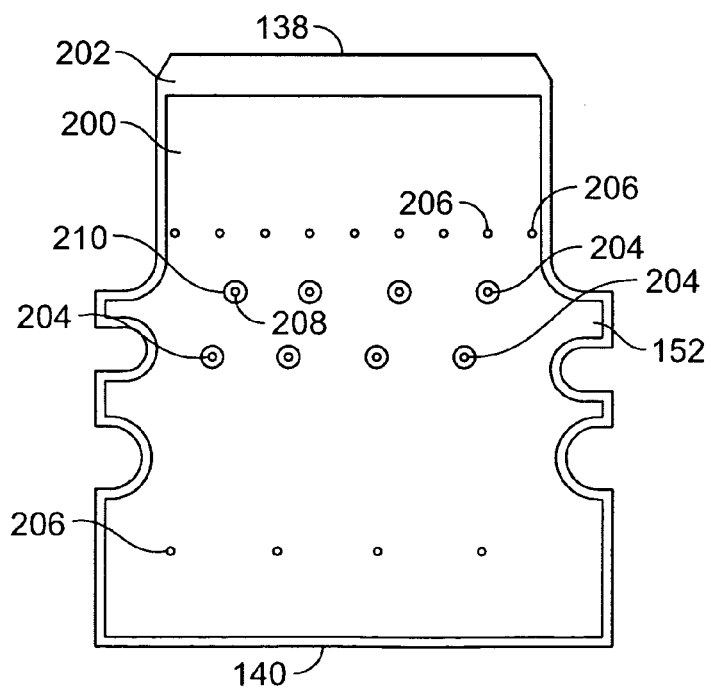
FIG. 5 illustrates a top view of a portion of the interface component of FIG. 3.

FIG. 5 illustrates a top view of the top ground layer 152 of the printed circuit board 120. The top ground layer 152 extends along a ground plane (not shown) that is arranged parallel to the circuit board plane 158 (FIG. 3). The top ground layer 152 includes a grounding surface 200 that is bordered by an insulating surface 202. The grounding surface 200 is fabricated from a material, such as, but not limited to, a metal material. The grounding surface 200 may be fabricated with a copper surface. The insulating surface 202 is fabricated from a similar material as the body 132 of the printed circuit board 120. The top ground layer 152 includes a plurality of vias 204 and a plurality of ground vias 206 that facilitate interconnecting the circuit components 130. Vias 204 correspond to and are substantially aligned with vias 162 of the top signal layer 150 (FIG. 4). Ground vias 206 correspond to and are substantially aligned with vias 164 of the top signal layer 150 (FIG. 4). Vias 204 include a conductive center body 208 and an insulating body 210 that surrounds the center body 208. As such, signal traces extending through vias 204 do not electrically communicate with the grounding surface 200.

Figure 6:
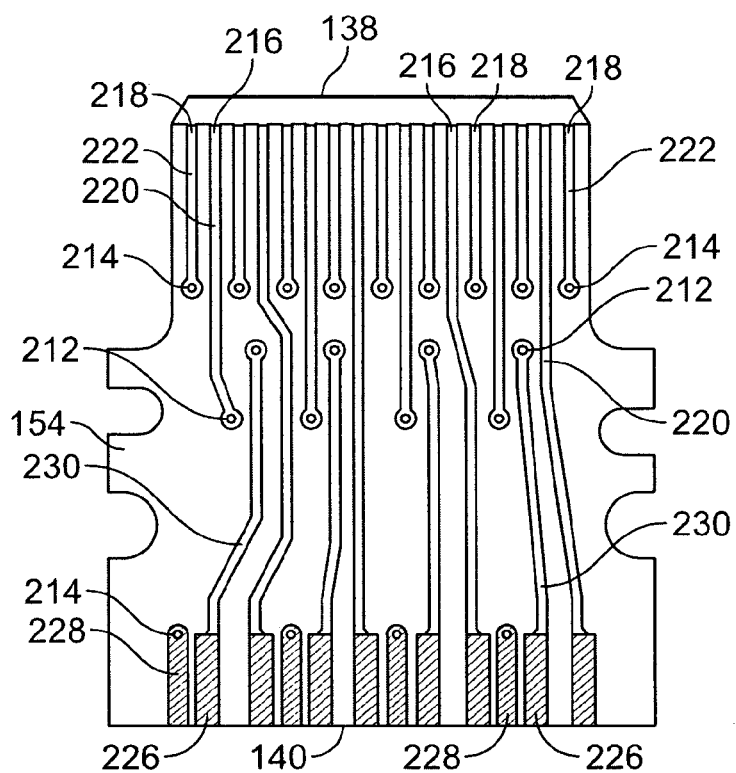
FIG. 6 illustrates a top view of a portion of the interface component of FIG. 3.

FIG. 6 illustrates a top view of the bottom signal layer 154 of the printed circuit board 120. The bottom signal layer 154 extends along a signal layer plane (not shown) that is arranged parallel to the circuit board plane 158 (FIG. 3). The bottom signal layer 154 includes the circuit components 130 and a plurality of vias 212 and ground vias 214. The vias 212 and ground vias 214 facilitate interconnecting the circuit components 130. The bottom signal layer 154 includes multiple signal contact pads 216 and multiple ground contact pads 218. The signal contact pads 216 and the ground contact pads 218 are aligned adjacent one another and located proximate the separable interface end 138. The signal contact pads 216 and the ground contact pads 218 electrically and frictionally engage corresponding circuit components (not shown) located with the mating connector. Each signal contact pad 216 is bordered on both sides by a ground contact pad 218. Alternatively, first and second signal contact pads 216 may be arranged immediately adjacent one another on the printed circuit board 120 and are bordered on only one side by a ground contact pad 218.

The signal contact pads 216 and the ground contact pads 218 include a signal trace 220 or a ground trace 222, respectively, that extends from the separable interface end 138 to another circuit component 130. In one embodiment, at least some of the signal traces 220 are interconnected to the other circuit components 130 by the vias 212. In another embodiment, at least some of the ground traces 222 are interconnected to the other circuit components 130 by the ground vias 214. Each of the ground traces 222 extending from the separable interface end 138 are coupled to a respective ground via 214 to facilitate electrically grounding the ground contact pads 218.

The bottom signal layer 154 includes multiple signal solder pads 226 and multiple ground solder pads 228. The signal and ground solder pads 226 and 228 have an enlarged area configured to be joined to a wire, as will be described in detail below. In one embodiment, each signal solder pad 226 is connected to a wire conveying a differential pair application signal. In another embodiment, each signal solder pad 226 is connected to a wire conveying a single ended application signal. The signal solder pads 226 and the ground solder pads 228 are aligned adjacent one another and located proximate the wire management end 140. The signal solder pads 226 are arranged immediately adjacent at least one of a signal solder pad 226 and a ground solder pad 228. Alternatively, each signal solder pad 226 may be bordered on both sides by a ground solder pad 228. The signal solder pads 226 include a signal trace 230 that extends from the wire management end 140 to another circuit component 130, and the ground solder pads 228 are directly connected to the ground vias 214 to facilitate electrically grounding the ground solder pads 228. Optionally, the ground solder pads 228 may be connected to ground traces prior to being electrically coupled to the ground vias 214. In one embodiment, at least some of the signal traces 230 are interconnected to the other circuit components 130 by the vias 212.

At least some of the signal traces 230 extending along the bottom signal layer 154 from the wire management end 140 are electrically and mechanically connected to some of the signal traces 170 extending along the top signal layer 150 from the separable interface end 138 by the vias 162 and 212. In another exemplary embodiment, at least some of the signal traces 220 extending along the bottom signal layer 154 from the separable interface end 138 are electrically and mechanically connected to some of the signal traces 180 extending along the top signal layer 150 from the wire management end 140 by the vias 162 and 212.

Figure 7:
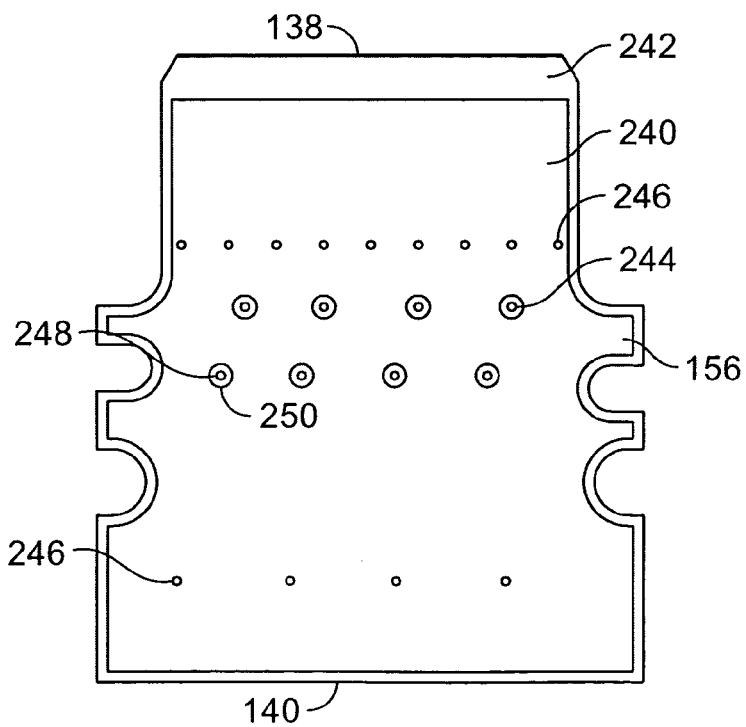
FIG. 7 illustrates a top view of a portion of the interface component of FIG. 3.

FIG. 7 illustrates a top view of the bottom ground layer 156 of the printed circuit board 120. The bottom ground layer 156 extends along a ground plane (not shown) that is arranged parallel to the circuit board plane 158 (FIG. 3). The bottom ground layer 156 includes a grounding surface 240 that is bordered by an insulating surface 242. The grounding surface 240 is fabricated from a material, such as, but not limited to, a metal material. The grounding surface 240 is fabricated from a copper surface. The insulating surface 242 is fabricated from a similar material as the body 132 of the printed circuit board 120. The bottom ground layer 156 includes a plurality of vias 244 and a plurality of ground vias 246 that facilitate interconnecting the circuit components 130. Vias 244 correspond to and are substantially aligned with vias 212 of the bottom signal layer 154 (FIG. 6). Ground vias 246 correspond to and are substantially aligned with vias 214 of the bottom signal layer 154 (FIG. 6). Vias 244 include a conductive center body 248 and an insulating body 250 that surrounds the center body 248. As such, signal traces extending through vias 244 do not electrically communicate with the grounding surface 240

Figure 8:
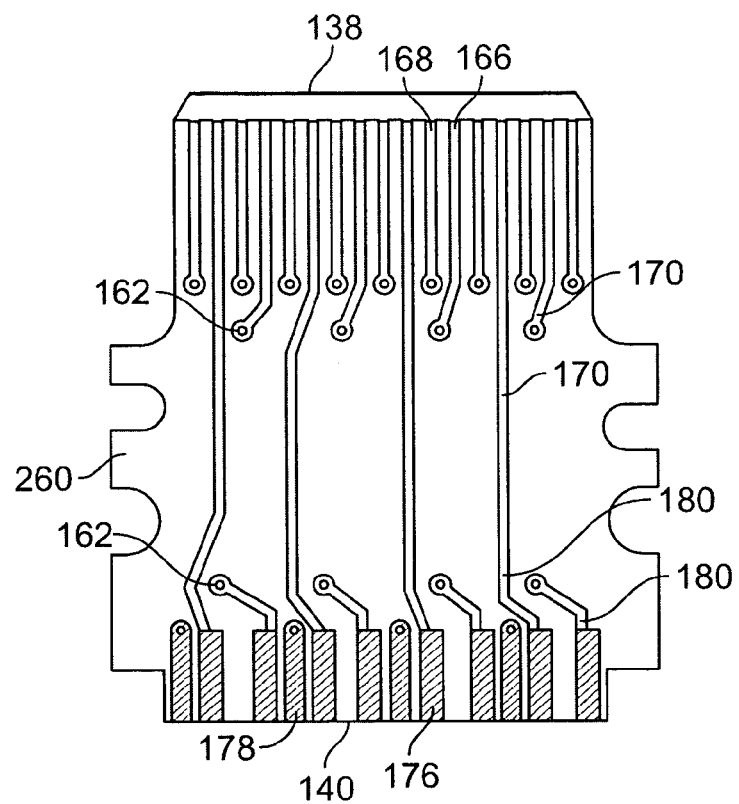
FIG. 8 illustrates a top view of a portion of an alternative interface component for use with the electrical connector shown in FIG. 1.
Figure 9:
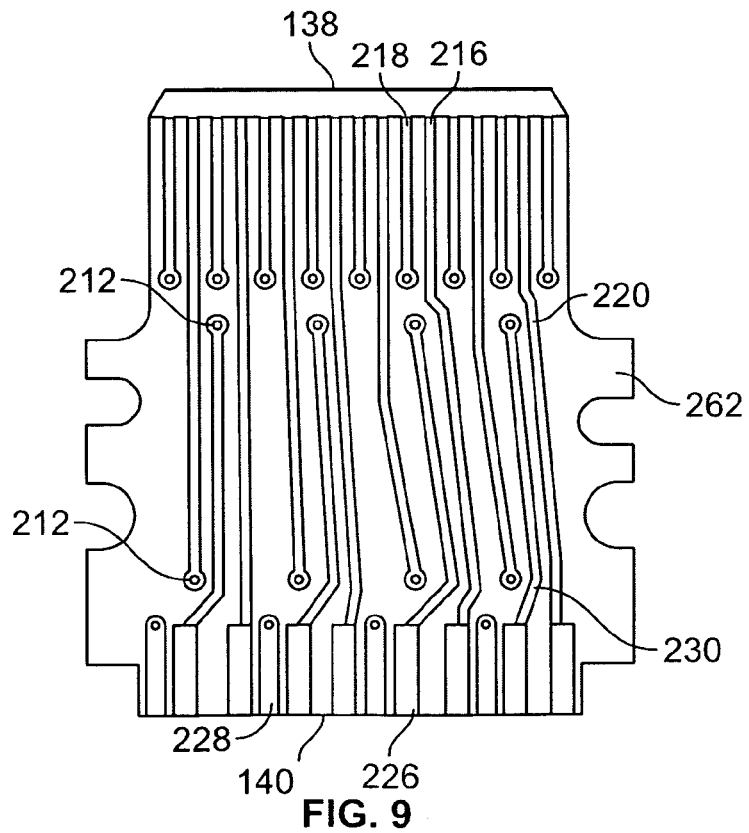
FIG. 9 illustrates a top view of a portion of the interface component of FIG. 8.

FIGS. 8 and 9 illustrate a top view of a top signal layer 260 and a bottom signal layer 262, respectively, of the printed circuit board 120 according to an alternative embodiment of the present invention. The printed circuit board 120 includes similar components to the embodiment described above. Like reference numerals are numbered the same as those described and shown with respect to FIGS. 2–7. The top signal layer 260 includes the signal contact pads 166, the ground contact pads 168, the signal solder pads 176, the ground solder pads 178, and the signal traces 170 and 180. The bottom signal layer 262 includes the signal contact pads 216, the ground contact pads 218, the signal solder pads 226, the ground solder pads 228, and the signal traces 220 and 230. However, in the embodiment illustrated in FIGS. 8 and 9, the vias 162 and 212 have an alternative location of the printed circuit board 120. Accordingly, the signal traces 170 and 180 have a different configuration. Additionally, the printed circuit board 120 illustrated in FIGS. 8 and 9 does not include the equalizing component receiving region 190 as shown in FIG. 4.

Figure 10:
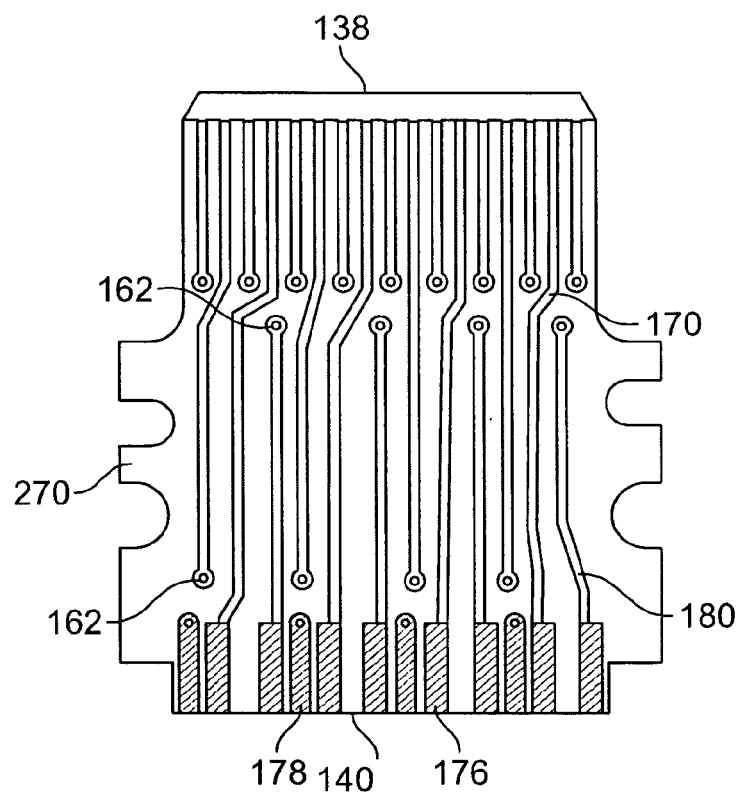
FIG. 10 illustrates a top view of a portion of another alternative interface component for use with the electrical connector shown in FIG. 1.
Figure 11:
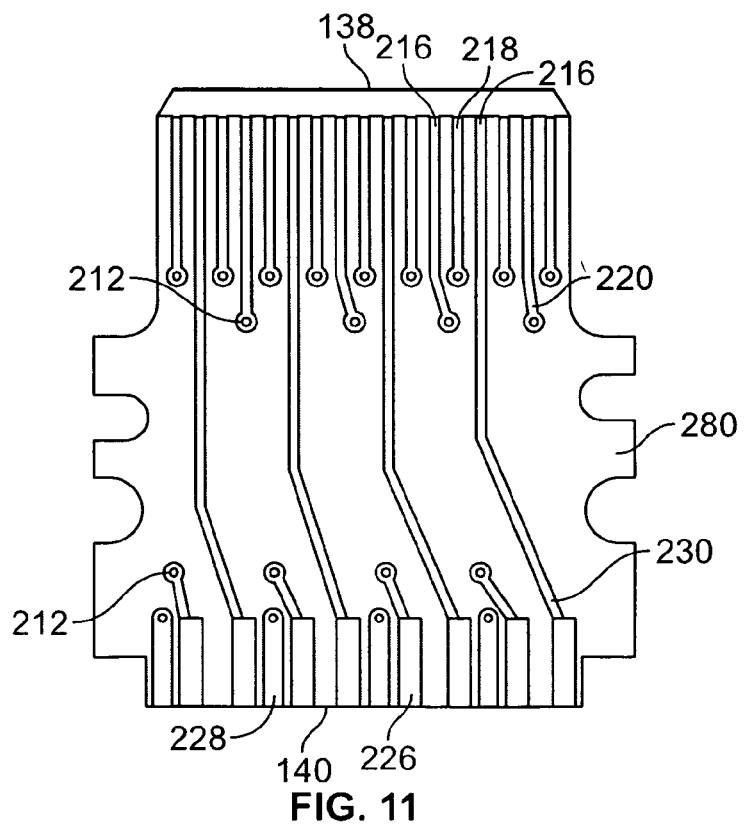
FIG. 11 illustrates a top view of a portion of the interface component of FIG. 10.

FIGS. 10 and 11 illustrate a top view of a top signal layer 270 and a bottom signal layer 272, respectively, of the printed circuit board 120 according to another alternative embodiment of the present invention. The printed circuit board 120 includes similar components to the embodiments described above. Like reference numerals are numbered the same as those described and shown with respect to FIGS. 2–9. The top signal layer 270 includes the signal contact pads 166, the ground contact pads 168, the signal solder pads 176, the ground solder pads 178, and the signal traces 170 and 180. The bottom signal layer 272 includes the signal contact pads 216, the ground contact pads 218, the signal solder pads 226, the ground solder pads 228, and the signal traces 220 and 230. However, in the embodiment illustrated in FIGS. 10 and 11, the signal traces 220 and 230 have a different configuration. Additionally, the printed circuit board 120 illustrated in FIGS. 10 and 11 do not include the equalizing component receiving region 190 as shown in FIG. 4.

Figure 12:
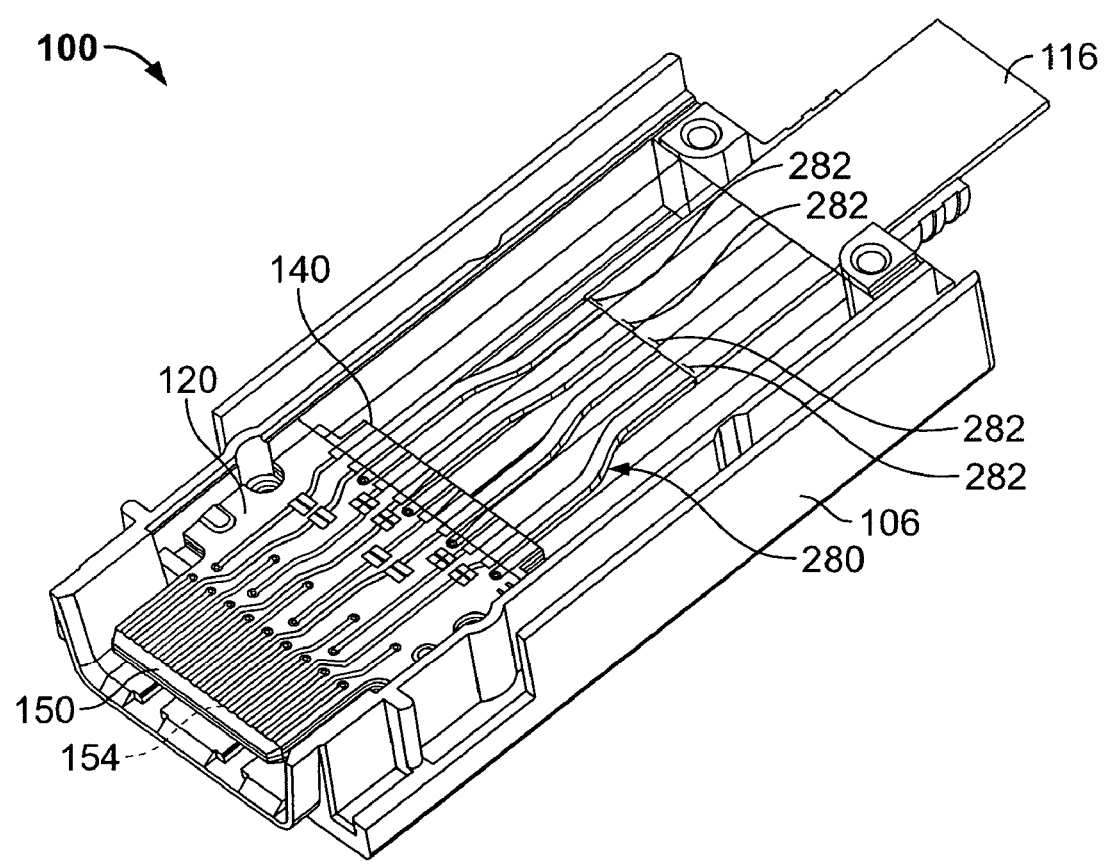
FIG. 12 illustrates a perspective view of a portion of the electrical connector shown in FIG. 1 with a plurality of cable wires electrically coupled to a printed circuit board housed within the electrical connector.

FIG. 12 illustrates a perspective view of a portion of the electrical connector 100 including the lower shell 106 and a plurality of wires 280 extending from the cable 116 and coupled to the printed circuit board 120. In one embodiment, the cable is coupled at one end (not shown) to an electronic device (not shown), such as, but not limited to, a conductor. The plurality of wires 280 are arranged in a plurality of differential pairs 282. In another embodiment, the plurality of wires 280 convey independent signals from one another, such that the wires 280 may be utilized in a single ended application. The wires 280 are connected to wire management end 140 of the printed circuit board 120, and, more particularly, to the signal solder pads 176, 178, 226, and 228, by a soldering connection. Moreover, the signal solder pads 176 and 226 are connected to the signal contact pads 166 and 216 by the signal traces 170, 180, 220 and 230, thereby completing the signal line through the printed circuit board 120 from the wire management end 140 to the separable interface end 138. The wires 280 are connected to both the top signal layer 150 and the bottom signal layer 154. Optionally, the wires 280 may only be coupled to one of the top signal layer 150 and the bottom signal layer 154.

The configuration of signal solder pads and ground solder pads along the top signal layer 150 and the bottom signal layer 154 may be varied, provided that the configuration does not afford undue reflection, signal interference or cross talk. Each of the top and bottom signal layers 150 and 154 include eight signal solder pads 176 and 226, respectively, such that the printed circuit board 120 accommodates up to sixteen wires 280, or eight differential pairs 282. Furthermore, the opposing wires 280 of the respective differential pairs 282 are connected to the printed circuit board 120 on directly opposite sides of the printed circuit board 120. Accordingly, a signal contact plane (not shown) extending between the opposing wires 280 of the differential pair 282 is oriented substantially perpendicular to the circuit board plane 158 (FIG. 3). Moreover, immediately adjacent signal solder pads 176 or 226 are connected to a wire 280 associated with a different differential pair 282. Alternatively, the opposing wires 280 of the respective differential pairs 282 may be connected to signal solder pads 176 or 226 located at any other position on the wire management end 140 of the printed circuit board 120. Optionally, the opposing wires 280 of the respective differential pairs 282 may be connected to an immediately adjacent signal solder pad 176 or 226.

In operation, each of the signals is single ended. As such, each trace carries an independent signal having a single ended impedance and can function without the need of any other signal having an opposite voltage to balance the electro-magnetic fields created by the individual signals. The top and bottom ground layers 152 and 156 provide the single ended coupling of each signal due to the close coupling of the trace to the ground layer. Specifically, the electromagnetic fields of each signal are constrained between the trace and the corresponding ground layer. As such, traces can be located in close proximity to other traces and not be located within the primary fields of one another. Therefore coupling and cross talk is limited between the fields. Optionally, two single ended signals may be coupled differentially by sending equal but opposite voltages on two separate traces. As such, the differential impedance is the sum of the individual single ended impedances. Furthermore, due to the single ended nature of the signals, the separate signals of the differential pair 282 can be transmitted from any location on the circuit board 120.

The above-described embodiments provide a cost effective and reliable means for operating electrical connectors 100. Specifically, the electrical connector 100 includes a printed circuit board 120 having a horizontal ground plane. Accordingly, the trace signals transmitted through the printed circuit board 120 are more strongly coupled to the ground layer 152 or 156 than to any other trace signal. As a result, cross talk between the independent trace signals is limited and, when the signals are arranged as differential pairs, cross talk is limited between independent differential pairs.

Exemplary embodiments of electrical connectors 100 are described above in detail. The electrical connectors 100 are not limited to the specific embodiments described herein, but rather, components of each electrical connector 100 may be utilized independently and separately from other components described herein. For example, each electrical connector 100 component can also be used in combination with other electrical connector 100 components.

While the invention has been described in terms of various specific embodiments, those skilled in the art will recognize that the invention can be practiced with modification within the spirit and scope of the claims.

What is claimed is:

1. An electrical connector, comprising:
    a housing;
    a circuit board provided in said housing, said circuit board having a body arranged along a circuit board plane, said body having a separable interface configured to directly join to a mating connector;
    a ground plane arranged parallel to said circuit board plane; and
    signal contacts provided on at least one side of said circuit board at said separable interface, wherein adjacent signal contacts on a common side of said circuit board are configured to convey differential pair signals, wherein each of the adjacent signal contacts on the common side of said circuit board is associated with a different differential pair;
    wherein the connector further comprises a ground layer embedded within said circuit board, said ground layer defining said ground plane.

2. The electrical connector of claim 1, wherein said signal contacts include first and second signal contacts located on opposite sides of said circuit board, said first and second signal contacts forming a differential pair.

3. The electrical connector of claim 1, wherein said signal contacts include first and second signal contacts located adjacent one another that are associated with different first and second differential pairs, respectively.

4. The electrical connector of claim 1, wherein said adjacent signal contacts are not separated by ground contacts.

5. The electrical connector of claim 1, wherein said signal contacts are arranged in a plane parallel to said ground plane and said circuit board plane.

6. The electrical connector of claim 1, wherein said signal contacts include first and second signal contacts forming a first differential pair, said first and second signal contacts being provided on opposite sides of said circuit board and opposite sides of said ground plane, said first and second contacts being aligned along a signal contact plane oriented perpendicular to said circuit board plane.

7. The electrical connector of claim 1, wherein said signal contacts include first and second signal contacts, said signal contacts being arranged remotely from each other.

8. The electrical connector of claim 1, wherein said housing has a first end configured to be joined to a mating connector and a second end configured to be joined to a conductor.

9. A circuit board configured to be utilized in an electrical connector, comprising:
  a body arranged along a circuit board plane, said body having a separable interface configured to directly join to contacts of a mating connector;
  a ground plane arranged parallel to said circuit board plane; and
  signal contacts provided on at least one side of said body at said separable interface, wherein adjacent signal contacts on a common side of said body are configured to convey differential pair signals, wherein each of the adjacent signal contacts on the common side of said circuit board is associated with a different differential pair;
  wherein the connector further comprises a ground layer embedded within said circuit board, said ground layer defining said ground plane.

10. The circuit board of claim 9, wherein said signal contacts include first and second signal contacts located on opposite sides of said circuit board, said first and second signal contacts forming a differential pair.

11. The circuit board of claim 9, wherein said signal contacts include first and second signal contacts located adjacent one another that are associated with different first and second differential pairs, respectively.

12. The circuit board of claim 9, wherein said adjacent signal contacts are not separated by ground contacts.

13. The circuit board of claim 9, wherein said signal contacts are arranged in a plane parallel to said ground plane and said circuit board plane.

14. The circuit board of claim 9, wherein said signal contacts include first and second signal contacts forming a first differential pair, said first and second signal contacts being provided on opposite sides of said circuit board and opposite sides of said ground plane, said first and second contacts being aligned along a signal contact plane oriented perpendicular to said circuit board plane.

15. An electrical connector, comprising:
  a housing;
  a circuit board provided in said housing, said circuit board having a body arranged along a circuit board plane, said body having a separable interface configured to directly join to a mating connector;
  a ground plane arranged parallel to said circuit board plane; and
  signal contacts provided on at least one side of said circuit board at said separable interface, wherein adjacent signal contacts on a common side of said circuit board are configured to convey single ended application signals, wherein each of the adjacent signal contacts on the common side of said circuit board is associated with a different single ended application signal;
  wherein the connector further comprises a ground layer embedded within said circuit board, said ground layer defining said ground plane.

16. The electrical connector of claim 15, wherein said signal contacts include first and second signal contacts configured to operate in single ended applications and are remotely positioned relative to each other regardless of signal contact function in the application.

17. The electrical connector of claim 15, wherein said signal contacts include first and second signal contacts carrying signals for separate single ended applications, said first and second signal contacts being arranged adjacent to one another and bordered only on one side by a ground contact.

18. The electrical connector of claim 15, wherein said signal contacts include first and second signal contacts carrying signals for separate single ended applications, said signal contacts being arranged randomly relative to the location of any other signal contact, regardless of function.

19. The electrical connector of claim 15, wherein said signal contacts are arranged in a plane parallel to said ground plane and said circuit board plane.

20. The electrical connector of claim 15, wherein said signal contacts include first and second signal contacts forming a first differential pair, said first and second signal contacts being provided on opposite sides of said circuit board and opposite sides of said ground plane, said first and second contacts being aligned along a signal contact plane oriented perpendicular to said circuit board plane.

* * * * *